United States Patent [19]

Gates

[11] 3,843,603

[45] Oct. 22, 1974

[54] LIGHT-SENSITIVE POLYMERIC ESTERS CONTAINING AZIDO SUBSTITUTED STYRYL GROUPS

[75] Inventor: Allen Peter Gates, Knaresborough, England

[73] Assignee: Howson-Algraphy Limited, London, England

[22] Filed: Oct. 19, 1972

[21] Appl. No.: 299,118

[30] Foreign Application Priority Data

Oct. 22, 1971 Great Britain .................... 49297/71

[52] U.S. Cl. ............... 260/47 EP, 96/88, 96/115 R, 96/36.2, 96/38.1, 101/395, 106/163 R, 106/169, 117/93.31, 117/124 E, 117/128.4, 117/138.8 A, 117/155 UA, 156/8, 260/9, 260/13, 260/49, 260/59, 260/47 EN, 260/91.3 VA, 260/212, 260/214

[51] Int. Cl. ............................................ C08g 30/04

[58] Field of Search ... 260/47 EP, 47 EN, 49, 2 EP, 260/349; 96/115 R; 204/159.15, 91.3 VA, 59 R, 47 UA, 47 UP, 9, 13

[56] References Cited

UNITED STATES PATENTS

| | | | |
|---|---|---|---|
| 3,539,559 | 11/1970 | Ruckert | 260/349 |
| 3,694,383 | 9/1972 | Azami | 260/2 XA |

FOREIGN PATENTS OR APPLICATIONS

| | | |
|---|---|---|
| 1,118,213 | 6/1968 | Great Britain |

*Primary Examiner*—Harold D. Anderson
*Assistant Examiner*—T. Pertilla
*Attorney, Agent, or Firm*—Nichol M. Sandoe

[57] ABSTRACT

A light sensitive polymeric ester comprises groups of the general formula $$N_3-R-(CR_1=CR_2)_a-(CR_3=CR_4)_b-COO-$$

attached to carbon atoms of a polyhydric material wherein a and $b$ are zero or 1 and $a+b$ is at least 1; R represents an aromatic radical optionally substituted with a group or groups additional to the azido group; and $R_1$, $R_2$, $R_3$ and $R_4$, which may be the same or different, represent halogen atoms, hydrogen atoms, cyano groups, alkyl groups, aryl groups, alkoxy groups, aryloxy groups, aralkyl groups or aralkoxy groups provided that at least one of the groups $R_1$ to $R_4$ represents a halogen atom or a cyano group. The polyhydric material is preferably an epoxy resin but may alternatively by a polyvinyl alcohol, a cellulose derivative, a novolak resin, or a phenoxy resin. Light sensitive members comprising a support coated with the polymeric ester are useful in the production of printing plates and printed circuits.

14 Claims, No Drawings

LIGHT-SENSITIVE POLYMERIC ESTERS CONTAINING AZIDO SUBSTITUTED STYRYL GROUPS

This invention relates to novel light-sensitive materials.

The light sensitive materials known as photopolymers are well known and are used e.g. as resists in photomechanical procedures such as the preparation of name plates and printed circuit boards and in the preparation of printing plates where the exposed, photo-hardened areas become the printing image. Such materials share two common undesirable features; there is no change in colour on exposure and there is need for addition of a, usually expensive, "super-sensitiser" in order to improve spectral sensitivity so as to obtain a reasonable exposure time to a light source common in industry e.g. an exposure of say 3 minutes to a carbon arc lamp or a pulsed xenon lamp. The prior art may be exemplified by (i) the material known as Kodak Photo Resist (R.T.M.) believed to be poly(vinyl cinnamate) which is described inter alia in British Patent Specification No. 695,197 and for which suitable super-sensitiers are described in British Patent Specification No. 743,455 (e.g. the addition of 3-methyl-2-benzoylmethylidene-β-naphthothiazoline as super-sensitiser increases the speed by 700 times); by (ii) Kodak Ortho Resist (R.T.M.) believed to be poly(vinyl cinnamylidene acetate)super-sensitised by a pyrylium salt and described in British Patent Specification No. 949,919; and by (iii) the polymeric cinnamoylated epoxy resins of British Patent Specifications Nos. 794,572, No. 913,764 and No. 921,530 where 4,4'-bis (dimethylamino) benzophenone is used as the supersensitiser. As stated above, layers of these materials do not change colour on exposure and yet this is a highly desirable characteristic in for example step and repeat work or where several different negative masters are used for exposure of different areas. Attempts in the past to add photochromic materials to make visible those areas which have been exposed to light have failed since, if enough is added to give a colour change which can be seen in the non-actinic light of the work area, the additive modifies the exposed area so as to effect its developability or its merit or as a printing image. This is probably due to dissolution of the photochromic material either in the developer or in the etchant or the printing ink, as the case may be, which makes the photoresist porous. The same effect is found in some cases where the super-sensitiser is leached out from the image area.

It has now been found that certain polymeric esters have the sought-after characteristics of giving a good change of colour on exposure and of being so fast per se as to not require a super-sensitiser for use under normal conditions although such a sensitiser may be added if desired to give for example a "camera-speed" printing plate blank. Photo resists produced from these esters do not have impaired characteristics in that they have resistance to etchants and a good wear life on a printing press.

According to the present invention there is provided a light sensitive polymeric ester comprising groups of the general formula $$N_3—R—(CR_1{=}CR_2)_a—(CR_3{=}CR_4)_b — COO —$$

attached to carbon atoms of a polyhydric material wherein $a$ and $b$ are zero or 1 and $a + b$ is at least 1; R represents an aromatic radical optionally substituted with a group or groups additional to the azido group; and $R_1$, $R_2$, $R_3$ and $R_4$, which may be the same or different, represent halogen atoms, hydrogen atoms, cyano groups, alkyl groups, aryl groups, alkoxy groups, aryloxy groups, aralkyl groups or aralkoxy groups provided that at least one of the groups $R_1$ to $R_4$ represents a halogen atom or a cyano group.

Light sensitive resin esters of azido-substituted aromatic acids have been described in the literature e.g. the epoxy resin azidobenzoates of U.K Specification 1,118,213 and the corresponding azido cinnamates of Czech Specification 135,029 but these known esters give only a rather weak change of colour on exposure and need added super-sensitisers to give an acceptable exposure speed. Therefore, it was not to be expected that the products of the present invention would give the desired characteristics and further, it was not to be expected that this would not be achieved at the expense of their performance as photoresists.

In one embodiment, the light sensitive polymeric ester of the invention comprises groups of the general formula $$N_3—R—(CR_1{=}CR_2)_a—(CR_3{=}CR_4)_b—COO—$$

attached to carbon atoms wherein $a$ is 1; $b$ is zero or 1; R, $R_2$, $R_3$ and $R_4$ have the meanings specified above; and $R_1$ represents a halogen atom or a cyano group. For example, in this formula, $a$ and $b$ may both be 1, R may be a phenyl group, $R_1$ may be a chlorine atom, $R_2$ and $R_3$ may be hydrogen atoms, and $R_4$ may be a hydrogen atom, a bromine atom, a chlorine atom or a cyano group.

In another embodiment, the light sensitive polymeric ester of the invention may comprise groups of the general formula $$N_3—R—(CR_1{=}CR_2)_a—(CR_3{=}CR_4)_b—COO—$$

attached to carbon atoms wherein $a$ and $b$ are zero or 1 and $a + b$ is at least 1; R represents an aromatic radical substituted with a group or groups additional to the azido group; and $R_1$, $R_2$, $R_3$ and $R_4$ which may be the same or different represent halogen atoms, hydrogen atoms, cyano groups, alkyl groups, aryl groups, alkoxy groups, aryloxy groups, aralkyl groups or aralkoxy groups provided that at least one of the groups $R_1$ to $R_4$ represents a halogen atom or a cyano group. For example, in this formula, $a$ may be zero, $b$ may be 1, $R_3$ may be hydrogen, $R_4$ may be a bromine atom, a chlorine atom or a cyano group, and R may be additionally substituted with a methyl group, a methoxy group, a bromine atom or a chlorine atom.

In accordance with the present invention the carbon atoms to which the ester groups are attached are provided by a polyhydric material. The polyhydric material is preferably an epoxy resin. However, other polyhydric materials such as phenoxy resins, poly(vinyl alcohol), cellulose, a cellulose ester or a novolak resin produced from a phenol and formaldehyde may be used. The esters of the invention may be prepared by reacting at least one acid chloride of formula $N_3$—R—$(CR_1{=}CR_2)a$—$(CR_3{=}CR_4)b$ COCl in which $a$, $b$, R, $R_1$ $R_2$ $R_3$ and $R_4$ have the aforesaid meanings with such a polyhydric material. The reaction may take place in the presence of a base which may be a tertiary amine which may also act as a solvent or also in the presence of other solvents such as dioxane, dimethylformamide, methylene chloride, or methyl ethyl ketone. Suitable tertiary amines are triethylamine, N-methyl piperidine, pyridine, quinoline, dimethylaniline, or their mixtures. Reaction is carried out preferably at 20°–70°C. Other methods of esterification will be apparent to those skilled in the art.

As polyhydric material there have proved to be particularly useful the epoxy resins derived from the condensation of bisphenol A and epichlorhydrin and corresponding to the formula

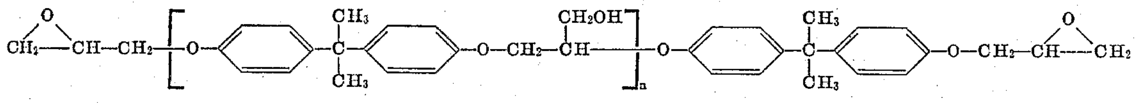

or

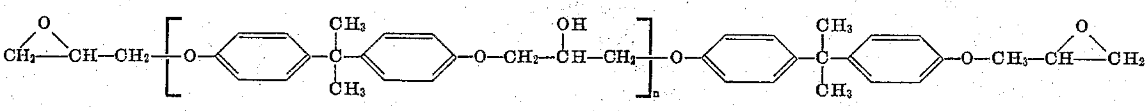

in which $n$ is preferably 9 to 12. Epoxy resins of the above type found to be useful are Epikote (R.T.M.) 1007 and Epikote (R.T.M.) 1009. These are commercially available products of the Shell Chemical Company and have the specifications

| Epikote Resin Grade | 1007 | 1009 |
|---|---|---|
| Epoxide equivalent weight | 1700–2050 | 2400–3400 |
| Viscosity of 40% w. solution in butyl 'Dioxitol' at 25°C poise | 16–26 | 40–110 |
| Specific Gravity 20°C | 1.19 | 1.19 |
| Average Molecular Weight | 2900 | 3750 |
| Esterification equivalent weight | 200 | 220 |
| Melting Point °C Durrans | 120–130 | 140–155 |

The condensation products of epichlorhydrin with other aromatic hydroxy compounds may be employed as polyhydric material. Examples of other aromatic hydroxy compounds which can be used include the bisphenols:

4,4' - dihydroxy diphenylmethane
4,4' - dihydroxy diphenylether
4,4' -dihydroxy diphenylsulphone.

Suitable acid chlorides are those derived from the following azido substituted acids:

(i)

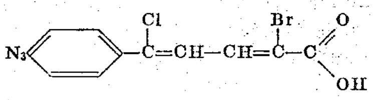

(ii)

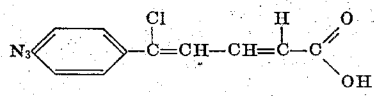

(iii)

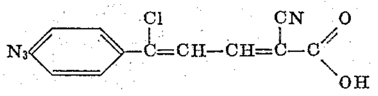

(iv)

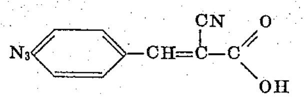

(v)

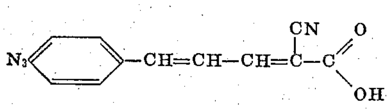

(vi)

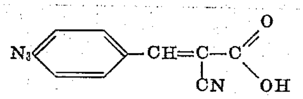

(vii)

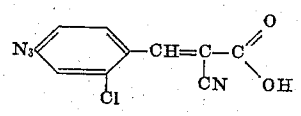

(viii)

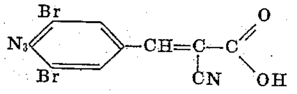

(ix)

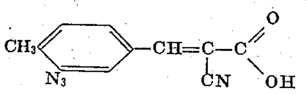

(x)

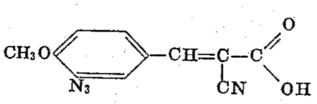

(xi)

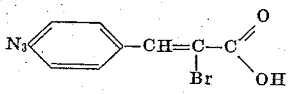

The acid chlorides may be used singly or in admixture with each other and/or in admixture with non-azido group-containing acid chlorides of aliphatic and aromatic carboxylic acids. In the case where non-azido group-containing acid chlorides are also used, the resultant ester will also contain ester groups derived from such acid chlorides. For example, in the case where the following acids are used, to wit: the acid chloride of acetic acid, propionic acid, 2-ethyl-hexanoic acid and benzoic acid, the resultant ester will also contain acetate, propionate, 2-ethyl-hexanoate or benzoate groups. The reaction of the non-azido group-containing acid chlorides with the polyhydric material may take place not only simultaneously with the reaction of the acid chloride of the above general formula but also previously or subsequently. Further, as is apparent from the examples hereinafter, the esters of the present invention may contain non-esterified hydroxyl groups.

A particularly preferred method for the manufacture of the esters of the present invention consists of first dissolving the polyhydric material, preferably an epoxy resin, in methyl ethyl ketone or dioxane to give a 10 to 40 percent solution, adding an acid chloride or a mixture of the acid chlorides or a mixture of an acid chloride and a non-azido group containing acid chloride, either alone or dissolved in methyl ethyl ketone or dioxane, followed by sufficient pyridine to convert all of the acid chloride; and heating the mixture at a temperature of between 40° & 60°C for 2 to 4 hours. The reaction mixture is diluted with 1:1 methyl ethyl ketone/toluene, filtered to remove the pyridinium chloride and dropped slowly into stirred alcohol. The esters are obtained as a yellow-brown powder.

As already indicated, the esters of the present invention are of particular value in the production of photographically produced printing plates and the like. The present invention therefore further includes a radiation-sensitive member comprising (i) a support of a material to which a film comprising an ester of the present invention will ahdere, such as glass, paper, resin impregnated paper, synthetic resin foil, or a metal sheet such as aluminium, zinc, magnesium and copper and (ii) a layer comprising an ester of the present invention carried by the support.

In order to apply the layer to the support, the light sensitive material which is to form the layer is dissolved in a suitable solvent or mixture of solvents, such as dioxane, ethylene glycol mono methyl ether acetate or ethylene glycol mono ethyl ether acetate, and the resultant solution is applied to the support in any manner, such as by dipping, spraying or whirler coating, after which the solvent is evaporated either by air drying or heating. The coating weight per square metre is generally between 0.2 and 2 gm.

For coating purposes in industry it may be desirable to add to the esters of the present invention one or more of the following: dyestuffs, plasticisers, wetting agents, supersensitisers (as previously mentioned), stabilisers, non-reactive polymers, photo-sensitive polymers and also materials capable of reacting with the photolysed azide groupings.

After the support has been coated with a film of the ester-containing light sensitive solution, it is dried to form a light sensitive member. When it is desired to use the members, the light sensitive coating is image-wise exposed for a time depending on the composition of the coating, the coating thickness, the support, the intensity of the light source, and the intended product. The unexposed areas will remain soluble thereby enabling the image to be developed using a suitable solvent or solvent emulsion developer.

The solvent or solvent mixture used for developing the image-wise exposed member must be selected with care, since it should have good solvent action on the unexposed areas, yet have little action on the hardened image. Suitable solvents include dioxane, ethylene glycol monomethyl ether acetate, ethylene glycol mono ethyl ether acetate and tetrahydrofurfuryl acetate.

By addition, to the developer, of poor or non-solvents for the unexposed areas such as propylene glycol or ethylene glycol monoethyl ether, it is possible to reduce the rate of dissolution of the unexposed material thus facilitating controlled development.

Preferred fields of application for the light sensitive materials and members according to the invention are the manufacture of printing plates and the manufacture of etch resists. The photopolymers are suitable for other purposes in addition to the printing uses e.g. in the preparation of printed circuits and the like, in chemical milling and for producing ornamental effects.

The following examples illustrate the invention.

EXAMPLE 1 a. Preparation of epoxy resin ester of 4-azido-α-cyano-δ-chlorocinnamylidene acetic acid 2.42g. of 4-azido-β-chlorocinnamaldehyde (prepared by a modification of the procedure given in U.S. Pat. No. 3,598,844) were dissolved in 50ml glacial acetic acid. 5.4g of cyanoacetic acid were added and the mixture heated at 80°C for 2 hours during which time the product separated as fine needles. After filtration the product was washed with glacial acetic acid (2 × 5ml) then dried over sodium hydroxide to give 1.4g of product. Recrystallisation from methanol gave dark yellow needles of 4-azido-α-cyano-δ-chlorocinnamylidene acetic acid (iii).

4g of the azido group-containing acid were heated with stirring with 25ml of redistilled thionyl chloride at reflux temperature for 6 hours. One half of the thionyl chloride was removed by vacuum distillation and the cooled solution poured into petroleum ether (boiling point range 40°–60°C). The acid chloride precipitated as an orange powder.

2.00g (0.01 g equivalents) of Epikote 1007 were dissolved in 30ml dioxane and 2.93g (0.01M) of the acid chloride was added. After stirring for 10 minutes, 1.0ml pyridine was added and the mixture was heated at 50°C for 4 hours. The pyridinium chloride was filtered off and the solution introduced dropwise into 400ml ethanol. The precipitated resin was filtered off and washed with more ethanol on the filter.

Yield: 3.41g.

The UV spectrum shows a maximum at 375nm

Extinction at 375nm $E_{1cm}^{1\%} = 510$ (dioxane).

b. Preparation of a printing plate 2.5g of the epoxy resin 4-azido-α-cyano-δ-chlorocinnamylidene acetic acid ester were dissolved in a mixture of equal volumes of dioxane and 2-methoxy ethyl acetate so as to give a 5 percent solution. The solution was diluted with toluene to 2.5 percent and then applied by means of a whirler to the surface of a sheet of electrograined aluminium so as to give a coating weight of 0.5g per square metre. After drying, the resultant light sensitive plate was exposed for 30 seconds in contact with a negative to a 4,000 watt pulsed xenon lamp at a distance of 0.65 metres. A deep yellow-brown colouration was produced in the light-struck areas. The exposed plate was developed using a mixture of glycol ester and wetting agent as described in Example 8 of British Patent Specification No. 1,220,808, rinsed with water and inked with a greasy ink.

EXAMPLE 2 a. Preparation of the epoxy resin ester of 4-azido-α-bromo-δ-chlorocinnamylidene acetic acid.

20.7g of 4-azido-β-chlorocinnamaldehyde in 200ml methylene chloride were added to a solution of 42.8g triphenyl carbethoxy bromo phosphorane in 200ml methylene chloride. The resulting solution was then allowed to stand for 60 hours. The solvent was removed in vacuo at 25°C and the resulting crystalline mass extracted with 6 × 50ml portions of n-pentane. Evaporation of the combined extracts in vacuo below 25°C gave 24.0g of the ester. 3.56g of the ester dissolved in 50ml methanol was treated with 10ml of 50 percent sodium hydroxide solution at 25°C. After 24 hours the solvent was removed in vacuo below 25°C and the sodium salt of the product extracted by washing the solid residue with hot water (5 × 100ml). Cooling the extracts gave the crystalline sodium salt which was converted by acidification (2N HCL) to give 4-azido-α-bromo-δ-chlorocinnamylidene acetic acid (formula i).

4g of 4-azido-α-bromo-δ-chlorocinnamylidene acetic acid was heated with 10ml thionyl chloride for 4 hours at 70°–75°C. 5ml thionyl chloride was removed in vacuo and the acid chloride isolated by stirring the mixture with petroleum ether (boiling point range 40°–60°C) and filtering.

2.00g (0.01 g equivalents) of Epikote 1,007 was dissolved in a mixture of 8ml methyl ethyl ketone and 8ml dioxane. 3.47g (0.01M) of the acid chloride was added and the mixture stirred for 10 minutes. 1.0ml pyridine was then added and the mixture heated at 50°C for two hours. After filtration the solution was introduced dropwise into ethanol and the precipitate filtered off and washed with more ethanol.

Yield: 2.23g

UV spectrum shows a maximum at 349nm

Extinction at 349nm $E_{1cm}^{1\%} = 270$ (dioxane).

b. Preparation of a printing plate 2.5g of epoxy resin 4-azido-α-bromo-δ-chlorocinnamylidene acetic acid ester was dissolved in a mixture of equal volumes of 2-methoxy ethyl acetate and dioxane so as to give a 5 percent solution. The solution was diluted with toluene to 2.5 percent and then applied by means of a whirler to the surface of a sheet of electro-grained, anodised aluminium so as to give a coating weight of 0.5g per square metre. The sheet was dried and then exposed and developed in the manner described in Example 1 (*b*). The sheet was rinsed with water and inked up.

Example 3 a. Preparation of the epoxy resin ester of 4-azidobenzylidene-α-cyanoacetic acid.

4-aminobenzaldehyde (Organic Syntheses, Collected Volume IV page 31, 1963) was diazotised and then reacted with sodium azide to give 4-azidobenzaldehyde. 15ml of 4-azidobenzaldehyde was added with shaking to a solution of 11g cyanoacetic acid dissolved in 78ml of a 7.5 percent aqueous solution of sodium hydroxide at 25–30°C. After 2 hours the yellow solid was filtered off, redispersed in 700ml water and acidified with hydrochloric acid. The 4-azidobenzylidene-α-cyanoacetic acid (formula iv) was filtered off, washed with water, dried and recrystallised from ethanol.

The acid chloride was prepared according to the method described in Example 2.

2.00g (0.01g equivalents) Epikote 1,007 was dissolved in 9ml methyl ethyl ketone and 1.64g (0.007M) of 4-azidobenzylidene-α-cyanoacetic acid chloride added. 1.0ml pyridine was added dropwise and the mixture heated at 50°C for 2 hours. The solution was filtered and introduced dropwise into ethanol. The precipitate was filtered off and washed with more ethanol.

Yield: 2.70g

UV spectrum shows a maximum at 345nm

Extinction at 345nm $E_{1cm}^{1\%} = 420$ (dioxane).

b. Preparation of a printing plate 2.5g of epoxy resin 4-azidobenzylidene-α-cyanoacetic acid ester was dissolved in 23ml 2-methoxy ethyl acetate and the volume made up to 100ml with toluene. 0.125g of Neozapon (RTM) Blue FLE (BASF), a phthalocyanine blue dye, was added and the mixture stirred for ten minutes. After filtration to remove any undissolved dye particles the solution was whirler coated onto the surface of a sheet of electrograined, anodised aluminium. The plate was dried and then exposed for 1 minute in the manner described in Example 1(b). The change in colour in the light-struck areas of the exposed plate was from blue to green, the green colour being the result of the combination of the blue dye and the yellow-brown photolysis product of the azide resin. The plate was developed in the manner described in Example 1(*b*), rinsed and inked with greasy ink.

The presence of dye in the coating facilitated development in that areas of the plate not contacted by the developer could be easily seen and left an easily visible image.

Example 4 a. Preparation of the epoxy resin ester of 4-azidobenzylidene-α-cyanoacetic acid.

2.00g (0.009g equivalents) of Epikote 1,009 was dissolved in 9ml methyl ethyl ketone followed by the addition of 0.58g (0.0025M) of the acid chloride of 4-azidobenzylidene-α-cyanoacetic acid (formula iv) and 1.0ml pyridine. The mixture was heated at 50°C for two hours, filtered and introduced dropwise into ethanol. The precipitated ester was collected and washed with more ethanol.

Yield: 2.31g

UV shows a maximum at 345nm

Extinction at 345nm $E_{1cm}^{1\%} = 133$ (dioxane).

b. Preparation of a printed circuit 5g of the epoxy resin ester product were dissolved in 45ml 2-methoxy ethyl acetate and the volume made up to 100ml with toluene. The solution was applied to the copper face of a plastics plate laminated with a copper foil by whirler coating at 80rpm and the coating was dried on by heating at 100°C for 2 minutes.

The plate was exposed for 3 minutes in contact with a negative of a printed circuit, developed by immersion in 2-methoxy ethyl acetate, dried and etched by soaking in 40 percent ferric chloride solution until the copper was completely removed from the areas not covered by the etch resist. A printed circuit resulted.

Example 5 a. Preparation of the epoxy resin ester of 4-azidobenzylidene-α-bromoacetic acid 4.41g of 4-azidobenzaldehyde in 100ml methylene chloride was added to 12.84g triphenyl-carbethoxy-bromomethylene phosphorane in 100ml methylene chloride and the resulting solution allowed to stand at room temperature for 60 hours. The solvent was removed in vacuo at room temperature to give a crystalline mixture of ester and triphenyl phosphine oxide from which the ester was extracted by repeated washing with n-pentane. Removal of the solvent in vacuo at room temperature from the combined extracts gave 7.86g of a pale yellow crystalline product. Melting point 59°–61°C.

3g of the ester dissolved in methanol was treated with 10ml of 50 percent sodium hydroxide solution at room temperature and allowed to stand for 24 hours. The solvent was removed in vacuo at 25°C, the residue dissolved in water, and the product (formula xi) precipitated by the addition of 2N hydrochloric acid.

The acid chloride was prepared according to the method described in Example 2.

2.00g (0.01g equivalents) Epikote 1007 was dissolved in 18ml dioxane followed by addition of 2.51g (0.01M) 4-azidobenzylidene-α-bromoacetic acid chloride and 1.0ml pyridine. The temperature was raised to 50°C and maintained for 4 hours. The pyridinium chloride was filtered off and the solution introduced dropwise into ethanol. The precipitated ester was collected and washed with more ethanol.

Yield: 2.10g

UV spectrum shows a maximum at 319nm

Extinction at 319nm $E_{1cm}^{1\%} = 198$ (dioxane).

b. Preparation of a printing plate 2.5g of epoxy resin 4-azidobenzylidene-α-bromoacetic acid ester was dissolved in 23ml 2-methoxy ethyl acetate and the volume made up to 100ml with toluene. The solution was applied by whirler to the surface of a sheet of electrograined, anodised aluminium. The process of Example 2(*b*) for the preparation of a printing plate was repeated except that an exposure time of 2 minutes was required.

Example 6 a. Preparation of the epoxy resin ester of 4-azido-2-chlorobenzylidene-α-cyanoacetic acid 2-chloro-4-aminobenzaldehyde, made according to the cited method for 4-aminobenzaldehyde, was diazotised and reacted with sodium azide to give 4-azido-2-chlorobenzaldehyde as a yellow solid. 7.35 g. of 4-azido-2-chlorobenzaldehyde, 2.50 ml. glacial acetic acid and 2.86 g. cyanoacetic acid were stirred at 50°C. for 4 hours whereupon 4-azido-2-chlorobenzylidene-α-cyanoacetic acid (formula vii) separated out as a pale yellow solid. The product was filtered off, washed with glacial acetic acid and water and recrystallised from methanol. Yield 6.9 g.

The acid chloride was prepared according to the method described in Example 2.

2.00 g. (0.01 g. equivalents) Epikote 1007 was dissolved in 9 ml. methyl ethyl ketone followed by addition of 2.68 g. (0.01 M) of 4-azido-2-chlorobenzylidine-α-cyanoacetic acid chloride and 1.0 ml. pyridine. The temperature was raised to 50°C. and maintained for 4 hours. After filtration the solution was dripped into ethanol and the precipitated resin collected and washed with fresh ethanol.

Yield: 2.40g.

UV spectrum shows a maximum at 342nm

Extinction at 342 nm $E_{1cm}^{1\%} = 110$ (dioxane).

b. Preparation of a printing plate

The process of Example 2(*b*) was repeated except that an exposure time of 2 minutes was needed.

Example 7 a. Preparation of the epoxy resin ester of 4-azido-3,5-dibromobenzylidine-α-cyanoacetic acid 10.30 g. of 4-aminobenzaldehyde was dissolved in a solution of 2.75 g. HCl in 660 ml. water by heating the mixture until it boiled. 8.50 ml. bromine dissolved in the minimum volume of water was added slowly and the mixture stirred for 30 minutes. The 4-amino-3,5-dibromobenzaldehyde separated as a light-brown precipitate. Yield 7.01 g.

4-Azido-3,5-dibromobenzaldehyde was prepared by diazotisation of the amine followed by reaction of the product with sodium azide.

6.5 g. 4-azido-3,5-dibromobenzaldehyde was mixed with 6.0 ml. glacial acetic acid and 2.02 g. of cyanoacetic acid and heated for 4 hours at 50°C. On cooling and allowing to stand at room temperature for 24 hours a crystalline mass of 4-azido-3,5-dibromobenzylidine-α-cyanoacetic acid (formula viii) separated out. The crystals were washed with a small amount of glacial acetic acid and then with a larger quantity of water. The product was recrystallised from methanol. Yield: 5.5 g.

The acid chloride was prepared according to the method described in Example 2(*a*).

2.00 g. (0.01 g. equivalents) Epikote 1007 was dissolved in 9 ml. methyl ethyl ketone and then 3.38 g. (0.01 M) of 4-azido-3,5-dibromobenzylidine-α-cyanoacetic acid chloride and 1.0 ml. of pyridine were added in that order. The temperature was raised to 50°C. and maintained for 4 hours. After filtration the resin was isolated by introducing the solution dropwise into ethanol.

Yield: 3.39 g.

UV spectrum shows a maximum at 334 nm

Extinction at 334 nm $E_{1cm}^{1\%} = 340$ (dioxane)

b. Preparation of a printing plate

The process of Example 1(*b*) was repeated except that a sheet of ball grained aluminium was used as the support member, and an exposure time of 2 minutes was required. After development and rinsing with water the plate was inked with greasy ink.

Example 8 a. Preparation of the epoxy resin ester of 3-azidobenzylidene-α-cyanoacetic acid 3-aminobenzaldehyde was diazotised and the product reacted with sodium azide to give 3-azidobenzaldehyde. This was condensed with cyanoacetic acid using the method described in Example 3(*a*), and the product (formula vi) converted to the acid chloride using the method described in Example 2(*a*).

2.00 g. (0.01 g. equivalents) Epikote 1007 was dissolved in 9 ml. methyl ethyl ketone. 2.10 g. (0.009 M) 3-azidobenzylidine-α-cyanoacetic acid chloride was added and the mixture stirred for ten minutes. 1.0 ml. pyridine was added and the temperature raised to 50°C. and maintained there for 2 hours. The resin was isolated by introducing the filtered solution into ethanol.

Yield: 3.14 g.

UV spectrum shows a maximum at 300 nm

Extinction at 300 nm $E_{1cm}^{1\%} = 370$ (dioxane).

b. Preparation of a printing plate 2.5 g. of epoxy resin 3-azidobenzylidine-α-cyanoacetic acid ester were dissolved in 23 ml. 2-methoxy ethyl acetate. The volume of the solution was made up to 100 ml. with toluene and 0.25 g. 1,2-benzanthraquinone was added. After filtration to remove any undissolved super-sensitiser particles the solution was whirled onto the surface of a sheet of electrograined, anodised aluminium to give a coating weight of 0.5 g./sq. metre. The dried plate was exposed for 1 minute and developed in the manner described in Example 1(*b*). The plate was rinsed and inked with greasy ink.

Example 9 a. Preparation of the epoxy resin ester of 3-azido-4-methylbenzylidine-α-cyanoacetic acid 425 ml. conc. sulphuric acid and 36 ml. conc. nitric acid were mixed and cooled in a dry ice-acetone bath to 0°C. 100 ml. of 4-tolualdehyde were added slowly with stirring, the temperature of the reaction mixture being maintained between −2° and +2°C. The resulting mixture was warmed to 40°C. and then allowed to cool to room temperature. The product was isolated by pouring in a thin stream into finely crushed ice. The yield of 3-nitro-4-tolualdehyde was 74 g.

50 g. each of 3-nitro-4-tolualdehyde, dry cyanoacetic acid and glacial acetic acid were heated at 100°C. for 7 hrs. The 3-nitro-4-methylbenzylidine-α-cyanoacetic acid was filtered off and washed with glacial acetic acid and water. Yield 32 g.

25 g. of 3-nitro-4-methylbenzylidine-α-cyanoacetic acid were dissolved in 350 ml. alcohol. 350 ml. water were added and the mixture heated to the boil. 55 g. of sodium dithionite were added slowly and the mixture refluxed for 30 minutes, cooled and acidified with hydrochloric acid. The solution was boiled until the smell of sulphur dioxide was no longer detectable. 50 ml. conc. hydrochloric acid were added and the mixture cooled to 0° to −5°C. A 40 percent solution of sodium nitrite was added until there was a permanent small excess of nitrous acid. 20 g. sodium azide in 50 ml. water was dropped in from a funnel and the precipitated 3-azido-4-methylbenzylidine-α-cyanoacetic acid (formula ix) was filtered at the pump. After washing with water 5.78 g. of the product were obtained.

The acid was converted to the acid chloride using the method described in Example 2(*a*).

1.00 g. (0.009 g. equivalents) Epikote 1007 was dissolved in 6 ml. methyl ethyl ketone and added to a solution of 0.99 g. (0.004 M) 3-azido-4-methylbenzylidine-α-cyanoacetic acid chloride in 6 ml. methyl ethyl ketone. 0.5 ml. pyridine was added and the mixture heated at 75°C. for 2 hours. After dilution with 8 ml. dioxane, the ester was isolated by dripping the solution into water.

Yield: 0.75 g.

UV spectrum shows a maximum at 298 nm

Extinction at 298 $E_{1cm}^{1\%} = 156$ (dioxane).

b. Preparation of a printing plate

The process of Example 2(*b*) was repeated with the sole variation that an exposure time of 2 minutes was necessary to produce the required image. The developed plate was rinsed with water and inked with greasy ink.

Example 10 a. Preparation of the epoxy resin ester of 3-azido-4-methoxybenzylidine-α-cyanoacetic acid 56.3 g. 4-anisaldehyde were added very slowly to a dry-ice-cooled mixture of 18.3 ml. conc. nitric acid and 366 ml. conc. sulphuric acid. After stirring for 1 hour the mixture was poured into a large volume of ice water to which dry ice was occasionally added. 3-Nitro-4-anisaldehyde precipitated out as a pale yellow solid. Recrystallisation from methylated spirits gave a yield of 30.3 g.

10.5 g. each of 3-nitro-4-anisaldehyde, dry cyanoacetic acid and glacial acetic acid were heated at 105°C. for 6 hours and 120°C. for a further 2 hours. On cooling and standing overnight 6.0 g. of 3-nitro-4-methoxybenzylidine-α-cyanoacetic acid were obtained. Reduction and conversion to 3-azido-4-methoxybenzylidine-α-cyanoacetic acid (formula x) was achieved by using the method described in Example 9(*a*) for the preparation of the 4-methyl substituted acid. The acid chloride was prepared according to the method described in Example 2(*a*).

1.6 g. (0.008 g. equivalent) Epikote 1007 was dissolved in 15 ml. methyl ethyl ketone and added to 1.58 g. (0.006 M) 3-azido-4-methoxybenzylidine-α-cyanoacetic acid chloride in 5 ml. methyl ethyl ketone. 1.0 ml. pyridine was added and the mixture heated at 75°C. for 2 hours. After filtration the solution was introduced dropwise into 400 ml. alcohol and the precipitate filtered off and washed with more alcohol.

Yield: 1.96 g.

UV spectrum shows a maximum at 323 nm

Extinction at 323 nm $E_{1cm}^{1\%} = 228$ (dioxane)

b. Preparation of a printing plate

The process of Example 2(*b*) was repeated except that the plate was exposed for 2 minutes and then developed with an emulsion consisting of 2 parts 10° Be gum solution containing 1 percent phosphoric acid, and 1 part 3-methoxybutyl acetate.

Example 11

4-Azido-α-cyanocinnamylidine acetic acid (formula v)

4-Azidocinnamaldehyde (used crude and prepared according to U.S. Pat. No. 3,598,844) was dissolved in 40 ml. dry pyridine and 2.8 g. cyanoacetic acid added. 4 drops of piperidine were added and the solution allowed to stand for 4 hours. The red solution was poured on to ice water containing 30 ml. conc. hydrochloric acid then 4 N HCl added dropwise with stirring to pH 5. The reddish brown solid was filtered and dissolved in ether then dried over magnesium sulphate. 0.1 g. charcoal was added and the solution filtered. The filtrate was concentrated to give 1.3 g. of a product which was recrystallised from ethyl acetate/petroleum ether. Melting point 174° – 5°C.

UV spectrum shows a maximum at 355 nm

Molar extinction coefficient at 355 nm:

34700 in methanol

An epoxy resin ester of the acid was prepared in an analogous method to that previously described and used to make a satisfactory printing plate.

EXAMPLE 12

4-Azido-δ-chlorocinnamylidene acetic acid (Formula ii)

20.7 g 4-Azido-β-chlorocinnamaldehyde was reacted with 34.5 g triphenyl carbethoxy methylene phosphorane in methylene chloride as in Example 2(*a*). In this case the ester was not isolated, the residue remaining after removal of the solvent being dissolved in 40 ml methanol and treated with 50 ml of 50 percent sodium hydroxide solution. After standing at room temperature for 18 hours the methanol was removed in vacuo below 30°C and the sodium salt of the product removed by extraction with 5 × 100 ml portions of warm water. Acidification of the cooled extracts with 2N hydrochloric acid gave 8.0 g of the carboxylic acid. Recrystallisation from methanol gave yellow micro crystals which decomposed above 160°C.

UV spectrum shows a maximum at 325 nm

Molar extinction coefficient at 325 nm = 37,150 in methanol

An epoxy resin ester was prepared analogously to those previously described and used to produce a satisfactory printing plate.

EXAMPLE 13 a. Preparation of the 4-azidobenzylidene-α-cyanoacetate of a polyvinyl alcohol

A mixture of 7.3 g Moviol NSO — 88 (RTM), a polyvinyl alcohol manufactured by Hoechst, and 79 ml pyridine was heated at 90°C for one hour. An additional 79 ml pyridine were added and the mixture cooled to room temperature. 38g of the chloride of 4-azidobenzylidene-α-cyanoacetic acid (formula iv) were then added in such a way that the temperature of the reaction mixture did not exceed 50°C. After stirring for 1.5 hours at this temperature the mixture was diluted with 160 ml dimethylformamide and then introduced dropwise into 4 litre of water. The precipitate was collected at the filter, redispersed in 1,500 ml ethanol and the mixture stirred for 30 minutes. After filtering the solid was washed with water on the filter and then dried at room temperature.

UV spectrum showed a maximum at 345 nm b. Preparation of a printing plate 2.5 g of the above product was stirred with 100 ml dimethylformamide at 40°C for 3 hours. After filtration the solution was applied to the surface of a sheet of electrograined, anodised aluminium by whirling at 80 r.p.m. The dried plate was exposed for 2 minutes in contact with a negative to a 4,000 watt pulsed xenon lamp at a distance of 0.65 metres. The plate was developed with a mixture of 1,100 ml dimethylformamide, 250 g Texafor D .1 (RTM), a polyoxyethylene condensate of a glyceride oil, and 10 ml concentrated sulphuric acid to which 10 percent water v/v had been added.

EXAMPLE 14 a. Preparation of epoxy resin benzoate 4-azidobenzylidene-α-cyanoacetate 6 g (0.03 g equivalents) Epikote 1007 were dissolved in 27 ml methyl ethyl ketone. 4.9 g (0.021 g equivalents) of the acid chloride of 4-azidobenzylidene-α-cyanoacetic acid (Formula iv) were added and the mixture stirred for 15 minutes. 1.2 ml benzoyl chloride and 3.0 ml pyridine were then added and the temperature raised to 50°C. This temperature was maintained for 2 hours. The mixture was then cooled and filtered and the filtrate introduced dropwise into ethanol. The precipitated ester was collected and washed with more ethanol.

Yield: 8.8 g

U.V. spectrum shows a maximum at 345 nm b. Preparation of a printing plate

The process of Example 2(*b*) was repeated with the sole variation that an exposure time of 1 minute was required.

EXAMPLE 15

Preparation of p-azidobenzalcyano-acetic acid

Equivalent weights of azidobenzaldehyde and cyanoacetic acid were condensed together, using glacial acetic acid as catalyst, for 4 hours at 55°C. The reaction mixture was cooled and the yellow solid filtered off, washed with cold water, and recystallised from ethanol.

Preparation of p-azidobenzalcyanoacetyl chloride

The acid as made above was refluxed with excess thionyl chloride for 4 hours. The acid chloride was isolated by precipitation into petroleum spirit.

Esterification with epoxy resin

An epoxy resin known as Epikote 1,009, which is derived from epichlorohydrin and Bisphenol A and has a molecular weight of about 3,750, was dissolved in methyl ethyl ketone and an equivalent weight of the acid chloride as made above was added. The mixture was heated on a water bath for five hours in the presence of a small amount of pyridine. The resultant ester was precipitated in industrial methylated spirits, washed with industrial methylated spirits and dried to form a pale yellow powder.

Preparation of a Printing Plate

A 3 percent solution of the ester as made above in a mixture of 2-methoxy ethyl acetate and toluene (1:3 by volume) was applied by means of a whirler to the surface of a sheet of grained aluminium which had been anodised in phosphoric acid electrolyte so as to give a coating weight of 0.5 g./sq.metre. After drying the resultant light sensitive plate was exposed to a negative and a Kodak No. 3 Step Wedge using a 2,000 watt pulsed xenon lamp for 1 minute. A deep yellow colouration was produced in the areas struck by light. The exposed plate was developed using a mixture of a glycol ester and a wetting agent as described in B.P. No. 1,220,808 and as marketed under the designation "Marathon Developer" by Howson-Algraphy Limited.

The developed plate was washed and inked. The image readily accepted ink. The image corresponding to the step wedge was solid at 9 and has a tail at 14.

We claim:

1. A light sensitive polymeric ester comprising groups of the general formula $$N_3 - R - (CR_1{=}CR_2)_a - (CR_3{=}CR_4)_b - COO -$$

attached to carbon atoms of a polyhydric polymeric material wherein *a* and *b* are zero or 1 and *a* + *b* is at least 1; R represents an aromatic radical optionally substituted with a group or groups additional to the azido group; and $R_1$, $R_2$, $R_3$ and $R_4$, which may be the same or different, represent halogen atoms, hydrogen atoms, cyano groups, alkyl groups, aryl groups, alkoxy groups, aryloxy groups, aralkyl groups or aralkoxy groups provided that at least one of the groups $R_1$ to $R_4$ represents a halogen atom or a cyano group.

2. A light sensitive polymeric ester as claimed in claim 1, wherein in the formula, *a* is 1; *b* is zero or 1, R, $R_2$, $R_3$ and $R_4$ have the meansings specified in claim 1, and $R_1$ represents a halogen atom or a cyano group.

3. A light sensitive polymeric ester as claimed in claim 2 wherein in the formula, *a* and *b* are both 1, R is a phenyl group, $R_1$ is a chlorine atom, $R_2$ and $R_3$ are hydrogen atoms and $R_4$ is a hydrogen atom, a bromine atom, a chlorine atom or a cyano group.

4. A light sensitive polymeric ester as claimed in claim 1 wherein in the formula R represents an aromatic radical substituted with a group or groups additional to the azido group and *a*, *b*, $R_1$, $R_2$, $R_3$ and $R_4$ have the meanings specified in claim 1.

5. A light sensitive polymeric ester as claimed in claim 4, wherein in the formula, *a* is zero, *b* is 1, $R_3$ is hydrogen, $R_4$ is a bromine atom, a chlorine atom or a cyano group and R is a phenyl group substituted with a methyl group, a methoxy group, a bromine atom or a chlorine atom.

6. A light sensitive polymeric ester as claimed in claim 1, which is an ester of a polyhydric material and an acid selected from 4-azido-α-bromo-δ-chlorocinnamylidene acetic acid, 4-azido-δ-chlorocinnamylidene acetic acid, 4-azido-α-cyano-δ-chlorocinnamylidene acetic acid, 4-azido-α-cyano cinnamylidene acetic acid, 3-azido-benzylidene-α-cyanoacetic acid,
4-azido-2-chlorobenzylidene-α-cyanoacetic acid,
4-azido-3,5-dibromobenzylidene-α-cyanoacetic acid,
3-azido-4-methyl-benzylidene-α-cyanoacetic acid,
3-azido-4-methoxybenzylidene-α-cyanoacetic acid, and
4-azido benzylidene-α-bromo cyanoacetic acid.

7. A light sensitive polymeric ester as claimed in claim 1 which is an ester of a polyhydric material and 4-azido benzylidene-α-cyanoacetic acid.

8. A light sensitive polymeric ester as claimed in claim 1 wherein the polyhydric material is an epoxy resin.

9. A light sensitive polymeric ester as claimed in claim 8, wherein the epoxy resin is the condensation product of a bisphenol and epichlorhydrin.

10. A light sensitive polymeric ester as claimed in claim 1 wherein the polyhydric material is a polyvinyl alcohol, a cellulose, a cellulose ester or a Novolak resin.

11. A light sensitive polymeric ester as claimed in claim 1 and additionally including ester groups derived from a non-azido group-containing acid chloride.

12. A light sensitive polymeric ester as claimed in claim 11, wherein said ester groups are derived from the acid chloride of acetic acid.

13. A light sensitive polymeric ester as claimed in claim 11, wherein said ester groups are derived from the acid chloride of benzoic acid.

14. A light sensitive polymeric ester as claimed in claim 1 and including free hydroxyl groups derived from the polyhydric material.

* * * * *